United States Patent [19]

Miura et al.

[11] Patent Number: 6,008,162
[45] Date of Patent: Dec. 28, 1999

[54] PRODUCTION METHOD OF OXIDE SUPERCONDUCTIVE FILM

[75] Inventors: Sadahiko Miura; Tadataka Morishita; Youichi Enomoto, all of Tokyo, Japan

[73] Assignees: NEC Corporation, Tokyo, Japan; International Conductivity Technology Center, Tokyo, Japan

[21] Appl. No.: 09/050,351

[22] Filed: Mar. 31, 1998

[30] Foreign Application Priority Data

Mar. 31, 1997 [JP] Japan ................................ 9-094480

[51] Int. Cl.$^6$ ......................... C30B 19/00; H01L 39/24
[52] U.S. Cl. ...................... 505/452; 505/451; 505/450; 505/733; 505/729
[58] Field of Search .................. 505/452, 451, 505/450, 729, 733; 427/62

[56] References Cited

U.S. PATENT DOCUMENTS 5,055,445  10/1991  Belt et al. .
5,077,271  12/1991  Hiskes et al. .
5,162,297  11/1992  Terashima et al. ................ 505/1

OTHER PUBLICATIONS

S.R. Foltyn et al., "Pulsed Lawser Deposition of Thick YBa Cu O _δ Films with J 1 MA/cm", Applied Physics Letters vol. 63, No. 13, Sep. 27, 1993, pp. 1848–1850.

T. Kitamura et al., "Field–Induced Pinning Center YBA Cu O ‾Superconducting Thick Film Prepared by Liquid Phase Epitaxy", Physica C vol. 256, (1996), pp. 64–72.

N. Newman et al., "High Temperature Superconducting Microwave Devices: Fundamental Issues in Material, Physics, and Engineering", Journal of Superconductivity vol. 6, No. 3, (1993), pp. 119–160.

Z. Ma et al., "RF Power Dependence Study of Large Area YBCO Thin Films", IEEE Transactions on Applied Superconductivity vol. 7, No. 2, Jun. 1997, pp. 1911–1916.

T. Kimura et al., "Growth Mechanism of Thick c–axis Oriented YBa C O _Films Prepared by Liquid Phase Epitaxy", Journal of Crystal Growth vol. 158, (1996), pp. 61–670 No Month Data!.

S. Miura et al., "Electrical Properties of YBaCuOx Films Grown by Liquid Phase Epitaxy", 6th International Superconductive Conference No. 2, J16, pp. 22–24 No Year and Month Data!.

*Primary Examiner*—Roy V. King
*Attorney, Agent, or Firm*—Sughrue, Mion, Zinn, Macpeak & Seas, PLLC

[57] ABSTRACT

The present invention can provide an oxide superconductive film with a smooth surface and at homogeneous thickness on a simple substrate structure at a high film formation rate. In a liquid phase epitaxial growth method for producing an $ReBa_2Cu_3Ox$ film (3) (Rerepresents one selected from lanthanoids such as Y and Nd, and X represents the oxygen amount) having a 123 type crystal structure from a molten liquid (1), a substrate (2) surface is inclined by 1 degree to 44 degrees with respect to the molten liquid surface at the time of separating the film from the molten liquid after film formation. After separating the film from the molten liquid, the substrate is rotated at 300 rpm to 3000 rpm for 5 seconds to 5 minutes. The film formation atmosphere contains 2 at. % of oxygen and 98 at. % of nitrogen, and the film formation temperature is 900 to 970° C.

10 Claims, 8 Drawing Sheets

PRODUCTION METHOD OF OXIDE SUPERCONDUCTIVE FILM

BACKGROUND OF THE INVENTION

1. Field of the Invention

The present invention relates to a production method of an oxide superconductive film with a smooth surface, and a high homogeneity in terms of the thickness. Furthermore, the present invention relates to a production method of an oxide superconductive film having excellent crystal properties and epitaxial properties, and good microwave characteristics.

2. Description of the Related Art

Nowadays, studies have been conducted on the electric power application and the electron device application, such as a superconductive lead, a superconductive wire, and a superconductive microwave element, using an oxide high temperature superconductor. As conditions in such an application, (1) a high zero resistance temperature, (2) a high critical current value, and (3) a large area, a homogeneity, and a surface smoothness are required. In order to meet the (2) condition, a thick film needs to be formed, and a high critical current density value is desired with the film thickness.

In order to meet the demands, a 1 $\mu$m thickness film formed by an eutectic vacuum evaporation method and a sputtering method is applied with a high temperature heat treatment in an oxygen atmosphere in a conventional method. However, the critical current density at 77K thereof is $10^5$ A/cm$^2$, which is about 1/50 in comparison with the maximum value of a thinner film.

Recently, Foltyn et al reported that a 6 $\mu$m thickness $Y_1Ba_2Cu_3Ox$ (YBCO) thin film formed on a $CeO_2$/YSZ (100) substrate by a pulse laser deposition method has a critical current density of $1 \times 10^6$ A/cm$^2$ in Applied Physics Letters Vol. 63, No. 13, Par. 1848–1850. It is reported that the substrate has a complicated multi-layer structure, and that the film formation rate of the pulse laser deposition method is as slow as; 0.1 to 0.2$\mu$m/min.

On the other hand, Kitamura et al reported that a 10 $\mu$m thickness $Y_1Ba_2Cu_3Ox$ film formed on 1 MgO (100) substrate by a liquid phase epitaxial growth method treated with a heat treatment at 450° C. for 5 hours in an oxygen atmosphere after the film formation has a critical current density of $1 \times 10^5$ A/cm$^2$ at 77K in Physical C Vol. 256, Par. 64–72. Since this film formation method has a high growth rate of about 2 $\mu$m/min and a high critical current value proportional to the product of the film thickness and the critical density value, it is promising as a film formation technique. However, since a Ba—Cu oxide as a part of a molten liquid adheres on the film, it is disadvantageous in terms of the surface smoothness and the homogeneity for a superconductive film (superconductive wire, superconductive microwave line) as an electron device.

Furthermore, nowadays studies have been conducted on the application of an electron device using an oxide high temperature superconductor. Above all, research and development are actively conducted on superconductive microwave passive elements (resonator, filter) according to the rapid development proceeding in the mobile communication field.

As conventional methods for producing superconductive films comprising the devices, a pulse laser deposition method, a sputtering method, a eutectic vacuum evaporation method, and a metalorganic chemical vapor deposition method are known. These films are reported to have a comparative good surface resistance value in a microwave region, for example, in Journal of Superconductivity Vol. 6, No. 3, Par. 119–160. However, these films also have problems to be solved. In general, it is known that a large intermodulation distortion in a high frequency device such as a resonator and a filter causes interference in the communication system. Therefore, in a resonator or a filter using a superconductive film, the intermodulation distortion needs to be minimized.

It is reported that the intermodulation distortion of an oxide superconductive film is reported to be strongly dependent on the production method and the production conditions, for example, in IEEE Transactions on Applied Superconductivity Vol. 7, No. 2, Par. 1911–1916. Although the existence of the grain boundary in a film is pointed out as the source thereof, it is reported that the alleviation thereof is difficult.

On the other hand, since a liquid phase epitaxial growth method of a $Y_1Ba_2Cu_3Ox$ film have growth conditions including a low supersaturation and a substantial thermal equilibrium, a high quality single crystalline film is reported to be produced at a high rate in, for example, Journal of Crystal Growth Vol. 158, Par. 61–67. Further, a liquid phase growth $Y_1Ba_2Cu_3Ox$ film is reported to have a very small intermodulation distortion of the surface resistance in the above-mentioned microwave region in, for example, Extended Abstracts of 6th International Superconductive Conference No. 2, J16.

However, the surface resistance value thereof is about 7 to 8 times as high as the value of films formed by a sputtering method and a pulse laser deposition method.

SUMMARY OF THE INVENTION

An object of the present invention is to provide an oxide superconductive film having a high critical temperature and a high critical current value on a simple substrate configuration at a high film formation rate Another object of the present invention is to provide a production method of a homogeneous excellent quality film by effectively preventing the partial adherence of a molten liquid to the substrate, which is problematic particularly in a liquid phase epitaxial growth method.

Yet another object of the present invention is to provide a $Y_1Ba_2Cu_3Ox$ film with a high critical temperature and a low surface resistance in a microwave region by a liquid phase epitaxial growth method.

Still another object of the present invention is to provide a production method of a film with a very small intermodulation distortion of the surface resistance in a microwave region, owing to the capability of producing a single crystalline film with very few grain boundaries, which are characteristic of a liquid phase epitaxial growth $Y_1Ba_2Cu_3Ox$ film, with a very small misorientation angle.

According to the present invention, a production method of an oxide superconductive film comprising a liquid phase epitaxial growth method for producing an $ReBa_2Cu_3Ox$ film (Re represents one selected from lanthanoids such as Y and Nd, and X represents the oxygen amount) having a 123 type crystal structure from a molten liquid, wherein a substrate surface is inclined by 1 degree to 44 degrees with respect to the molten liquid surface at the time of separating the film from the molten liquid after film formation, can be provided.

Further, according to the present invention, a production method of an oxide superconductive film comprising a liquid phase epitaxial growth method for producing an ReBa$_2$Cu$_3$Ox film having a 123 type crystal structure from a molten liquid, wherein the atmosphere at the time of forming the film and cooling the substrate contains at least 2 at. % of oxygen, can be provided.

Further, according to the present invention, a production method of an oxide superconductive film comprising a liquid phase epitaxial growth method for producing an ReBa$_2$Cu$_3$Ox film having a 123 type crystal structure from a molten liquid, wherein the difference between the film formation temperature and the decomposition temperature of ReBa$_2$Cu$_3$Ox at 1 atmospheric pressure is 30° C. or less, can be provided.

DESCRIPTION OF THE PREFERRED EMBODIMENTS

In the present invention, an oxide superconductive film is produced by a liquid phase epitaxial growth method applied with an oxide superconductive single crystal production technique, and is to be applied in a superconductive wire, a superconductive microwave element, and the like. By the use of the liquid phase epitaxial growth method, a thick film having excellent crystal property and in-plane orientation can be produced at a high film formation rate on a substrate with a simple structure.

Furthermore, it was found out that deterioration of the film homogeneity and the surface smoothness caused by a partial residual molten liquid on the substrate, which is problematic in a liquid phase epitaxial formation film, can be solved as a whole by separating the substrate from the molten liquid with an inclination angle, utilizing the viscosity of the molten liquid. It was further revealed that the molten liquid remained at the corners of the substrate after separating the substrate from the molten liquid with the inclination angle can be eliminated with the centrifugal force by rotating the substrate at a high speed. According to the present invention, a superconductive film having good crystal property and superconductive property, and excellent homogeneity and surface smoothness can be produced for a superconductive wire, a superconductive microwave element, and the like. Therefore, significant effects can be achieved by the present invention.

Moreover, the present invention is to produce an oxide superconductive film by a liquid phase epitaxial growth method applied with a single crystal production technique, and apply the same to a superconductive wire, a superconductive microwave element, and the like. By the use of the liquid phase epitaxial growth method, a thick film having excellent crystal property and in-plane orientation can be produced at a high film formation rate on a substrate with a simple structure.

It was also found out that the crystal property and the in-plane orientation can be further improved by having a 2% or more oxygen partial pressure at the time of forming the film and cooling the substrate. In additions it was revealed that the surface resistance value in a microwave region can be drastically reduced according to the rise of the oxygen partial pressure. According to the present invention, a superconductive film having good crystal property and superconductive property, and a low surface resistance value in a microwave region can be produced for a superconductive wire, a superconductive microwave element, and the like. Therefore, significant effects can be achieved by the present invention.

Hereinafter a first embodiment of the present invention will be explained.

Figure 1:
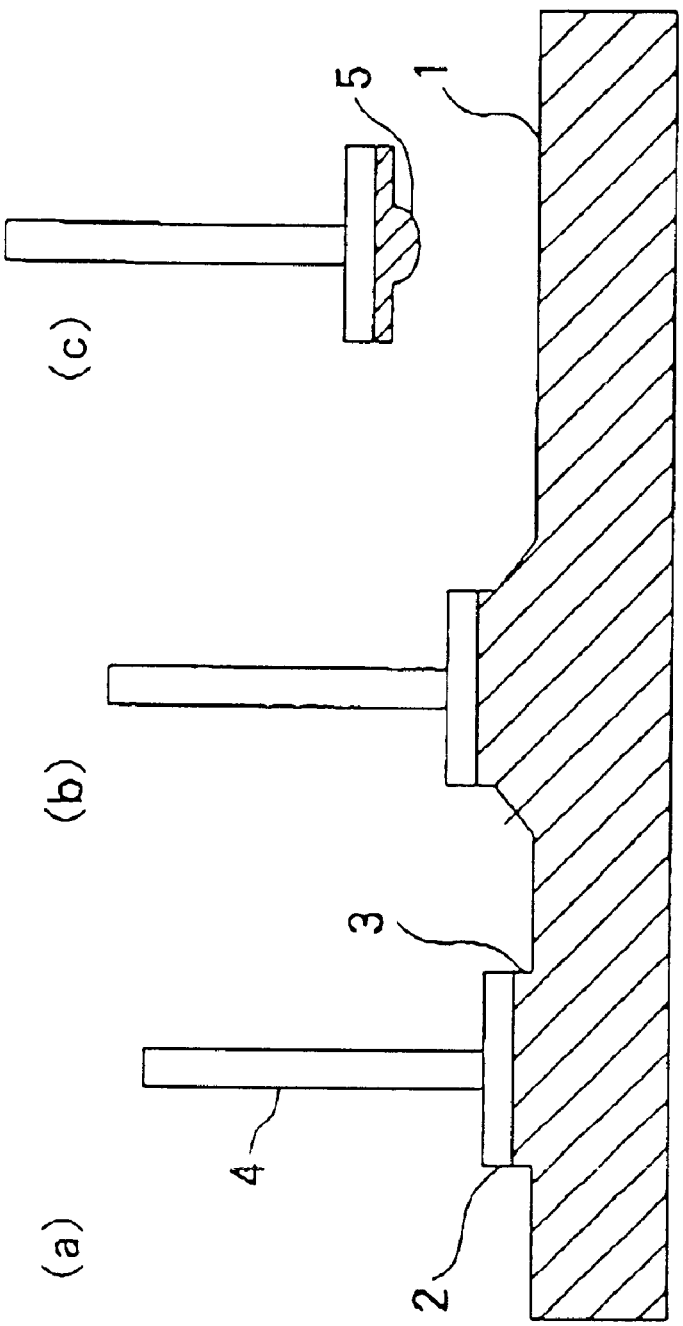
FIG. 1 is a schematic diagram of a conventional liquid phase epitaxial growth method.
Figure 2:
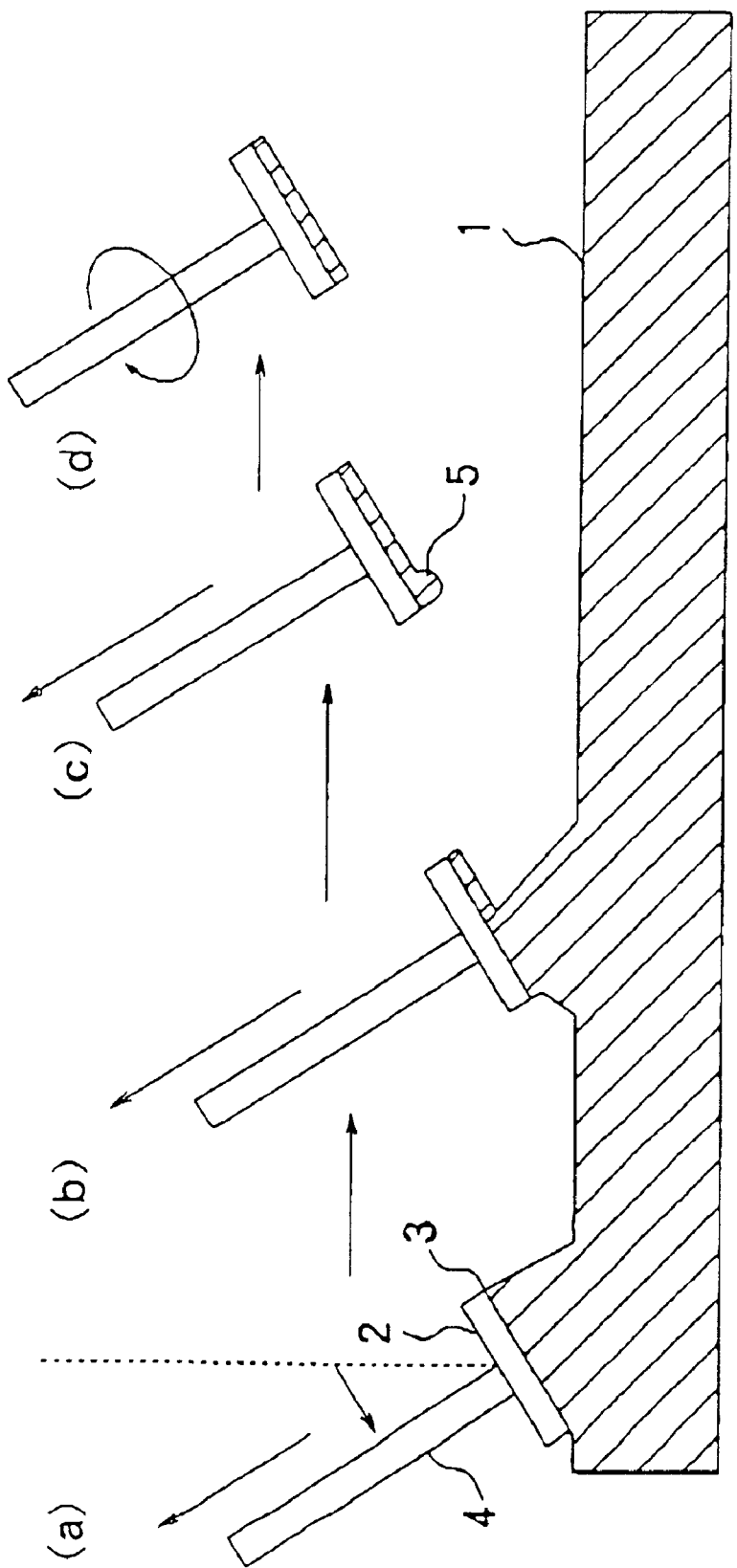
FIG. 2 is a schematic diagram of a liquid phase epitaxial growth method of the present invention.

FIG. 2 is a schematic diagram of a liquid phase epitaxial growth method of the present invention. FIG. 1 is a schematic diagram of a conventional epitaxial growth method provided for comparison. A molten liquid 1 for the liquid phase epitaxial growth consisting of 10% by weight of Y$_1$Ba$_2$Cu$_3$Ox and 90% by weight of Ba$_3$Cu$_7$O$_{10}$ was used, and as a seed crystal (substrate) 2, MgO (100) was used. Herein, X represents the oxygen amount. The seed crystal (substrate) 2 has a square or round shape. The film formation atmosphere was prepared with 2 at. % of oxygen and 98 at. % of nitrogen. The film formation temperature was 960 to 970° C. As shown in FIG. 1(a), by soaking the seed crystal (substrate) 2 in the molten liquid 1, a Y$_1$Ba$_2$Cu$_3$Ox film 3 can be formed.

After finishing the film formation, as shown in FIG. 1(b), a rotation axis 4 supporting the seed crystal 2 was gradually pulled. With an ordinary pulling method, as shown in FIG. 1(c), a part of a molten liquid with residual Ba—Cu 5 remains in the vicinity of the substrate center after pulling so as to generate peel-off of the Y$_1$Ba$_2$Cu$_3$Ox film 3 under the molten liquid with residual Ba—Cu 5 and cleavage of the seed crystal 2 itself due to the difference between the heat expansion coefficients of the molten liquid with residual Ba—Cu 5, the Y$_1$Ba$_2$Cu$_3$Ox film 3 and the seed crystal 2.

Figure 3A:
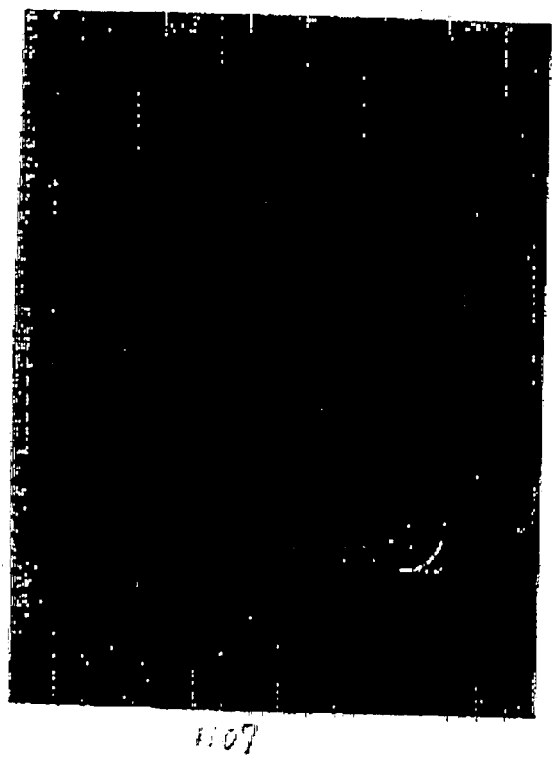
FIG. 3A is an actual microphotograph of a film produced in a first embodiment of the present invention.
Figure 4:
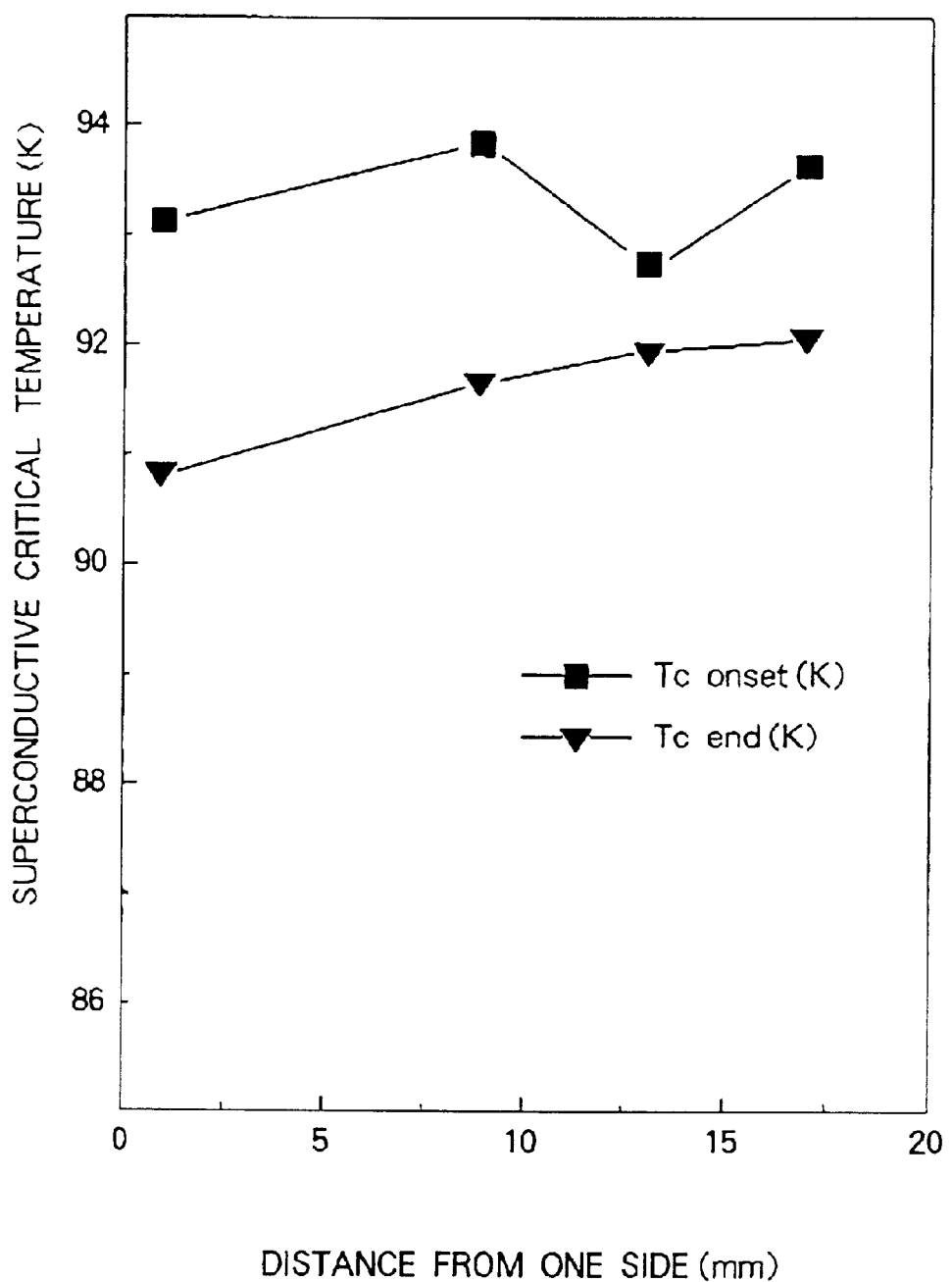
FIG. 4 is a graph showing the relationship between the position on a substrate and a superconductive critical temperature of an oxide superconductive film produced by the present invention.

In the present invention, by inclining the substrate as shown in FIG. 2(a), excessive Ba—Cu molten liquid can be removed owing to the wettability between the Y$_1$Ba$_2$Cu$_3$Ox film 3 and the Ba—Cu molten liquid 1 and the viscosity of the Ba—Cu molten liquid 1 itself at the time of gradually pulling the rotation axis 4 supporting the seed crystal 2 and gradually separating the molten liquid from the substrate with optimum pulling rate and inclination angle after the film formation. Further, as shown in FIG. 2(c) the molten liquid with residual Ba—Cu 5 can be sent at the substrate corners in this method. FIG. 3A is an actual microphotograph of a thin film produced in this method. A marker graduated in millimeters is provided at the left side. As apparent from the figure, a substantially homogeneous thin film can be produced in a 20 mm×20 mm region except a portion where the $Y_1Ba_2Cu_3Ox$ film is peeled off by the molten liquid with residual Ba—Cu 5 at the right down portion. FIG. 4 shows the in-plane distribution of the superconductive characteristic of the specimen. A distance from one side is plotted in the horizontal axis, and a superconductive critical temperature is plotted in the vertical axis. The specimen was applied with a heat treatment at 600° C. for 10 hours, 500° C. for 10 hours, and 400° C. for 60 hours in an oxygen atmosphere after the thin film formation. As apparent from the figure, a 90K or more zero resistance temperature (Tc end) characteristic is provided in the region so that it can be learned that a good and homogeneous superconductive characteristic is provided. Further, a 92K or more superconductivity starting temperature (Tc onset) is provided so that it can also be learned that a good and homogeneous superconductive characteristic is provided.

From the experiment, it was confirmed that the molten liquid is separated from the substrate when tire substrate is away from the molten liquid surface by about 7 mm. Therefore, with a 10 mm diameter minimum substrate size, the maximum inclination angle is about 44 degrees. On the other hand, with a 1 degree or less inclination angle, the viscosity of the molten liquid cannot function well so that a lot of residual molten liquid was observed in the film after pulling. Therefore, the appropriate inclination angle of the substrate with respect to the molten liquid surface is considered to be 1 degree to 44 degrees.

The pulling rate in this experiment was 1 mm to 10 mm/min.

A second embodiment of the present invention will be explained.

Figure 3B:
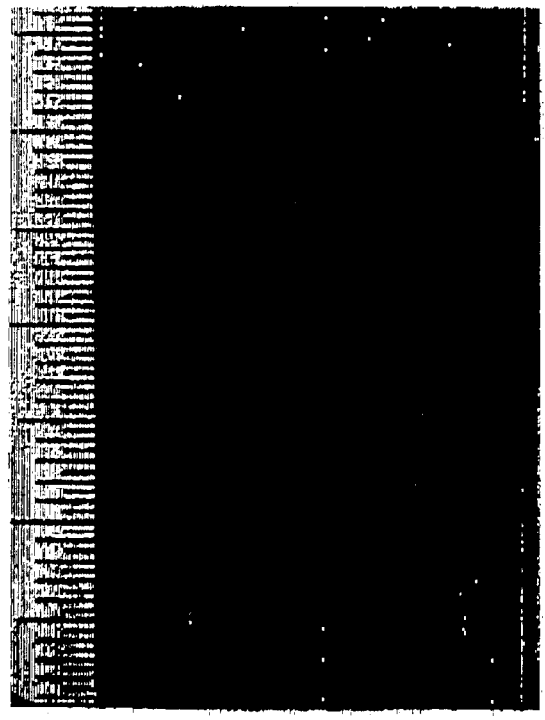
FIG. 3B is an actual microphotograph of a film produced in a second embodiment of the present invention.

After forming a thin film in the same conditions as the first embodiment and separating from a molten liquid 1 with the pulling method shown in FIG. 2, the pulled seed crystal 2 was rotated at 1000 rpm for 10 seconds around the central axis 4 as shown in FIG. 2(d) in a place with a 900 to 960° C. temperature. The centrifugal force on the molten liquid with residual Ba—Cu 5 on the substrate corners at the time is proportional to $\omega^2 \times R$ ($\omega$=angular rotating speed of the pulling axis, R=distance from the pulling axis center to the molten liquid with residual Ba—Cu 5) so that a force for separating the liquid from the substrate functions. FIG. 3B is an actual microphotograph of a thin film produced in the conditions. Unlike FIG. 3A, a portion with the $Y_1Ba_2Cu_3Ox$ film peeled off caused by the molten liquid with residual Ba—Cu 5 cannot be found, and thus it can be observed that the molten liquid with residual Ba—Cu 5 was eliminated by the high speed rotation. As a result, a homogeneous thin film was produced in a 23 mm×23 mm region. The in-plane distribution of the superconductive critical temperature of the film shown in FIG. 3B was the same as FIG. 4, and thus it was learned that a homogeneous and high quality thin film can be produced.

As a result of the experiment, it was confirmed that an appropriate rotation speed of the substrate is 300 rpm to 3000 rpm, and an appropriate substrate rotation time is 5 seconds to 5 minutes.

A third embodiment of the present invention will be explained.

Figure 5:
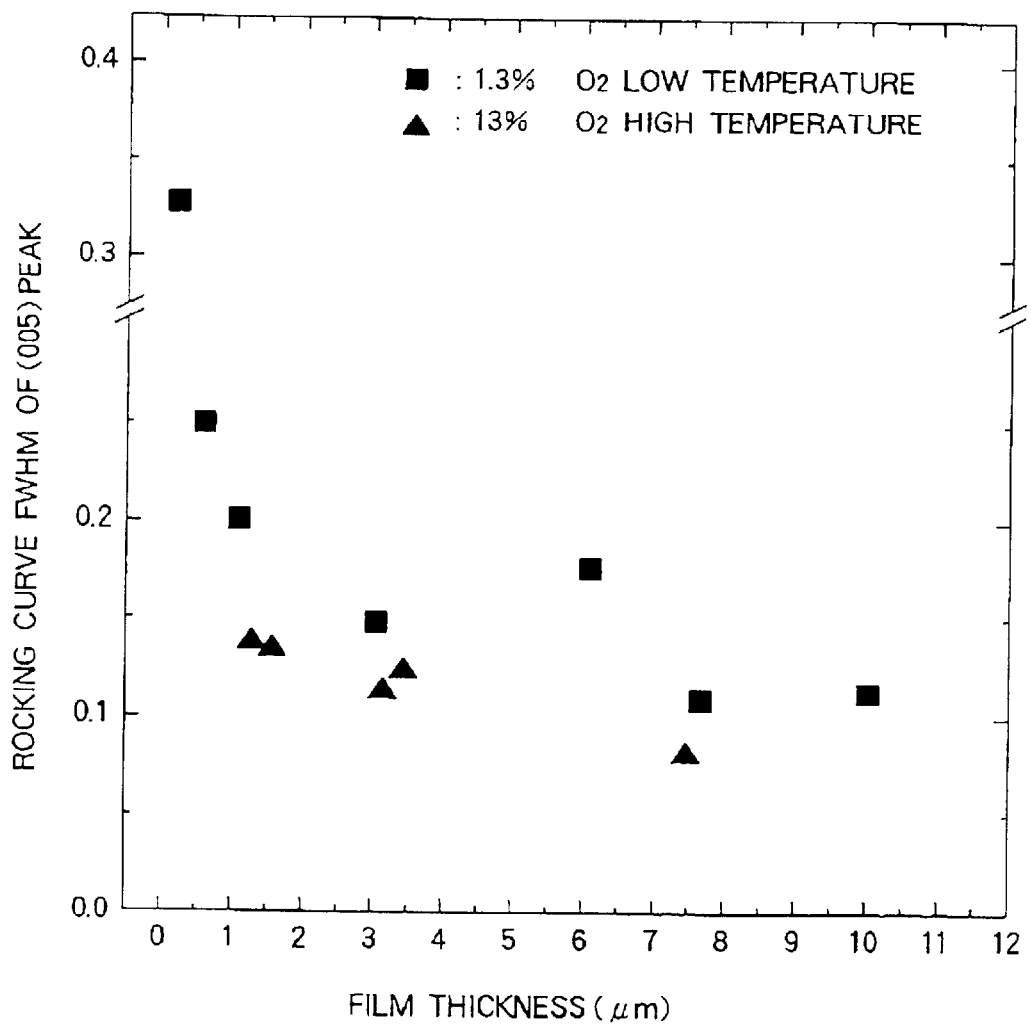
FIG. 5 is a graph showing the film thickness dependency of the full width at half maximum of the rocking curve of the θ-2θ X-ray diffraction peal (005) of a Y$_1$Ba$_2$Cu$_3$Ox film produced by a liquid phase epitaxial growth method in a third embodiment of the present invention.

An $Y_1Ba_2Cu_3Ox$ film was produced by a liquid phase epitaxial growth method. A molten liquid for the liquid phase epitaxial growth consisting of 18% by weight of $Y_1Ba_2Cu_3Ox$ and 82% by weight of $Ba_3Cu_7O_{10}$ was used, and as a seed crystal substrate, MgO (100) was used. FIG. 5 shows the film thickness dependency of the full width at half maximum of the rocking curve of the θ–2θ X-ray diffraction peak (005) of the obtained film. In FIG. 5, square marks represent data of a film produced with an atmosphere with 1.3 at. % of oxygen and 98.7 at. % of nitrogen at the time of film formation and cooling, and a film formation temperature of 958° C. (a film produced with a low oxygen atmosphere and a low temperature). The decomposition temperature of the $Y_1Ba_2Cu_3Ox$ film at 1 atmospheric pressure is 1000° C. In FIG. 5, triangle marks represent data of a film produced with an atmosphere with 13 at. % of oxygen and 87 at. % of nitrogen at the time of film formation and cooling, and a film formation temperature of 980° C. (a film produced with a high oxygen atmosphere and a high temperature). The C axis was strongly oriented vertically with respect to the substrate in all the films. With the film thickness increase, the half band width of the rocking curare tends to decrease in both conditions. This is owed to the average particle size increase according to the film thickness increase. Further, it can be observed that the film produced with the high oxygen atmosphere and the high temperature has a smaller full width at half maximum of the rocking curve with any film thickness compared with the film produced with the low oxygen atmosphere and the low temperature (square marks in FIG. 5). That is, the film produced with the high oxygen atmosphere and the high temperature has an excellent crystal property.

A fourth embodiment of the present invention will be explained.

Figure 6A:
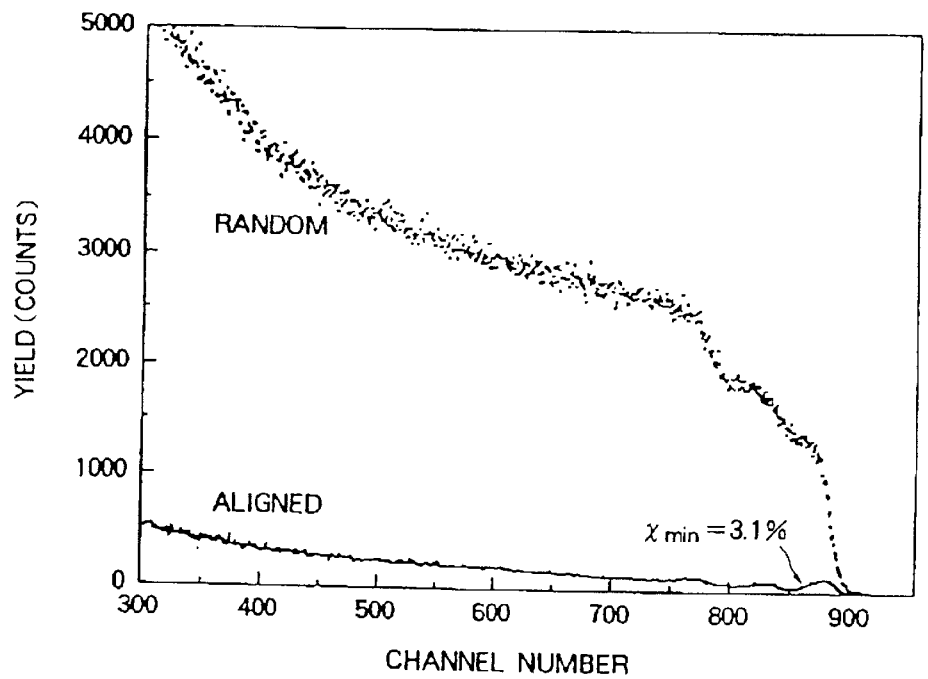
FIG. 6A is a graph showing spectra of a film produced in a low oxygen atmosphere at a low temperature by a liquid phase epitaxial growth method evaluated by the Rutherford backscattering method in a fourth embodiment of the present invention.
Figure 6B:
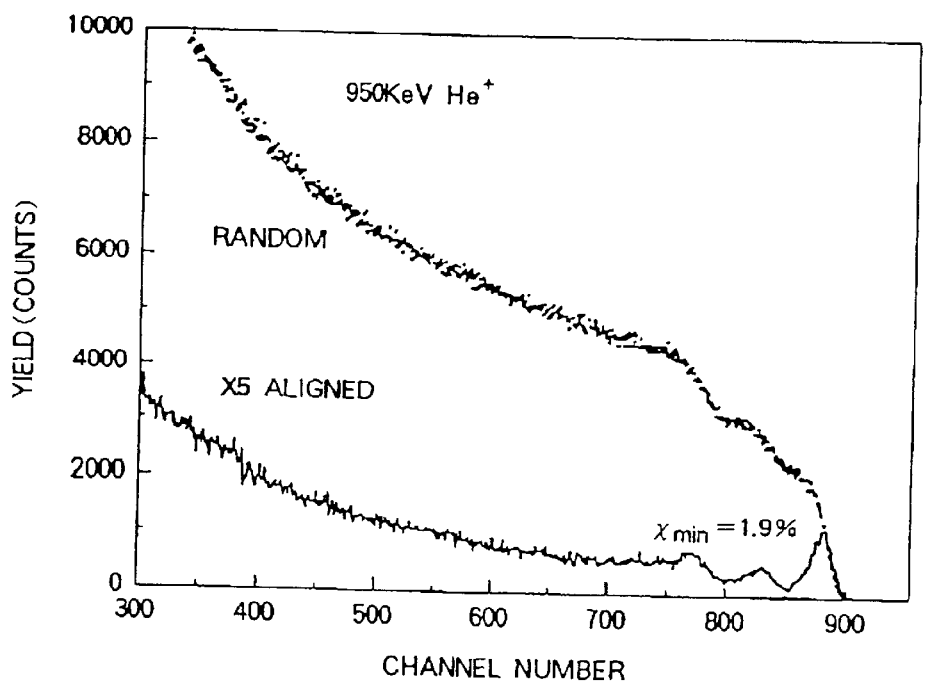
FIG. 6B is a graph showing spectra of a film produced in a high oxygen atmosphere at a high temperature by a liquid phase epitaxial growth method evaluated by the Rutherford backscattering method in the fourth embodiment of the present invention.

Spectra of the films produced by the same two production conditions as the third embodiment evaluated by the Rutherford backscattering method (RBS) are shown in FIGS. 6A and 6B. The film thickness was 2 μm in each condition. FIG. 6A shows RBS spectra of a film produced in a low oxygen atmosphere at a low temperature, and FIG. 6B shows RBS spectra of a film produced in a high oxygen atmosphere at a high temperature, respectively.

It can be observed that the aligned spectrum is lower than the random spectrum in either specimen Although the χ min value (the ratio between the aligned spectrum and the random spectrum at the aligned spectrum minimum value at around the channel number 860) in FIG. 6A is 3.1%, which shows a comparatively good epitaxial property, it can be considered that still the crystal property is slightly disturbed. On the other hand, the χ min value of the specimen in FIG. 6B is 1.9%, which shows an extremely good epitaxial property that is almost the limit of the detection sensitivity of the RBS device. Accordingly, a film produced in a high oxygen atmosphere at a high temperature shows a further good epitaxial property in comparison with a film produced in a low oxygen atmosphere at a low temperature.

Figure 7:
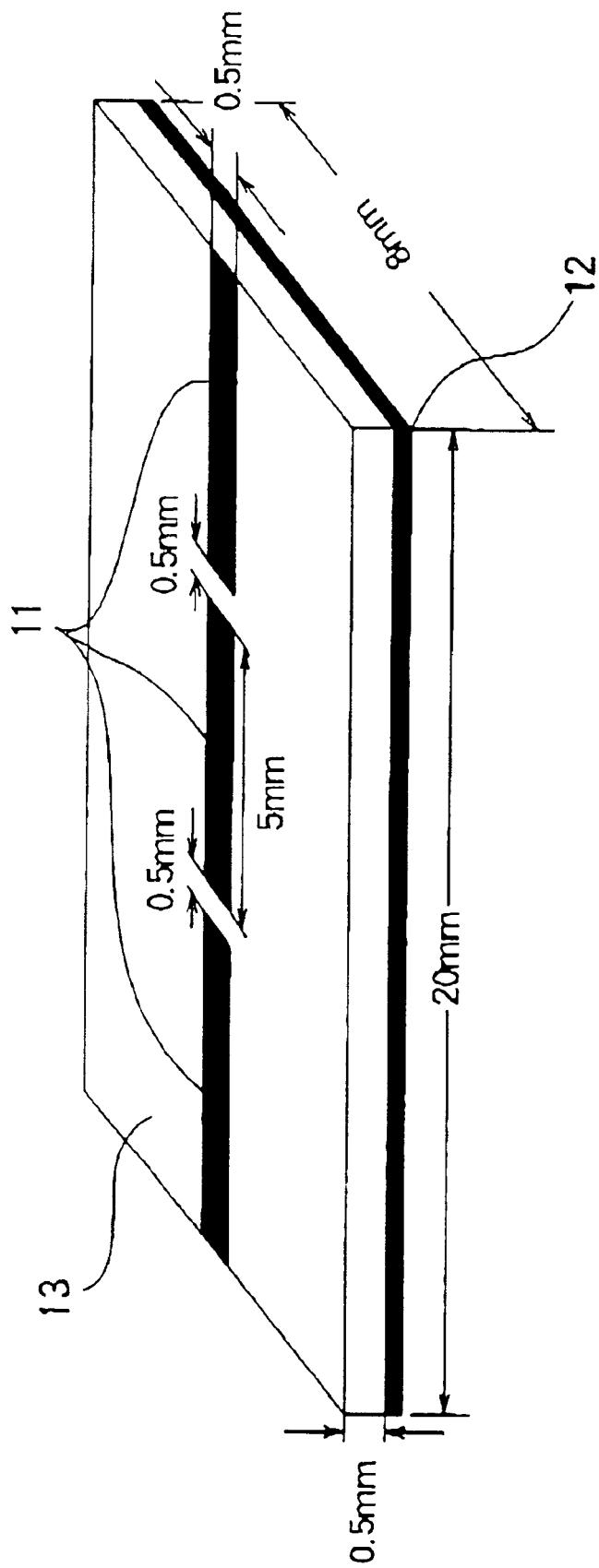
FIG. 7 is a schematic diagram of a micro strip resonator for measuring the microwave surface resistance value of a liquid phase epitaxial growth film in a fifth embodiment of the present invention.

A fifth embodiment of the present invention will be explained. With a film produced in the same conditions as the third embodiment, a micro strip resonator shown in FIG. 7 was produced, and characteristics thereof were examined. The size of a substrate 13 was 20 mm length and 8 mm width. A strip portion 11 had a 5 mm central length and a 0.5 mm width, with a coupling gap of 0.6 mm. The resonance frequency was about 10.8 GHz. The strip portion 11 was made of a liquid phase epitaxial growth film. A ground portion 12 was made of a 1 μm film thickness $Y_1Ba_2Cu_3Ox$ film produced by a pulse laser deposition method. In order to oxidize the liquid phase epitaxial growth $Y_1Ba_2Cu_3Ox$ film, a heat treatment was conducted after the film formation in an oxygen atmosphere at 500° C. for 50 hours and 400° C. for 60 hours.

Figure 8:
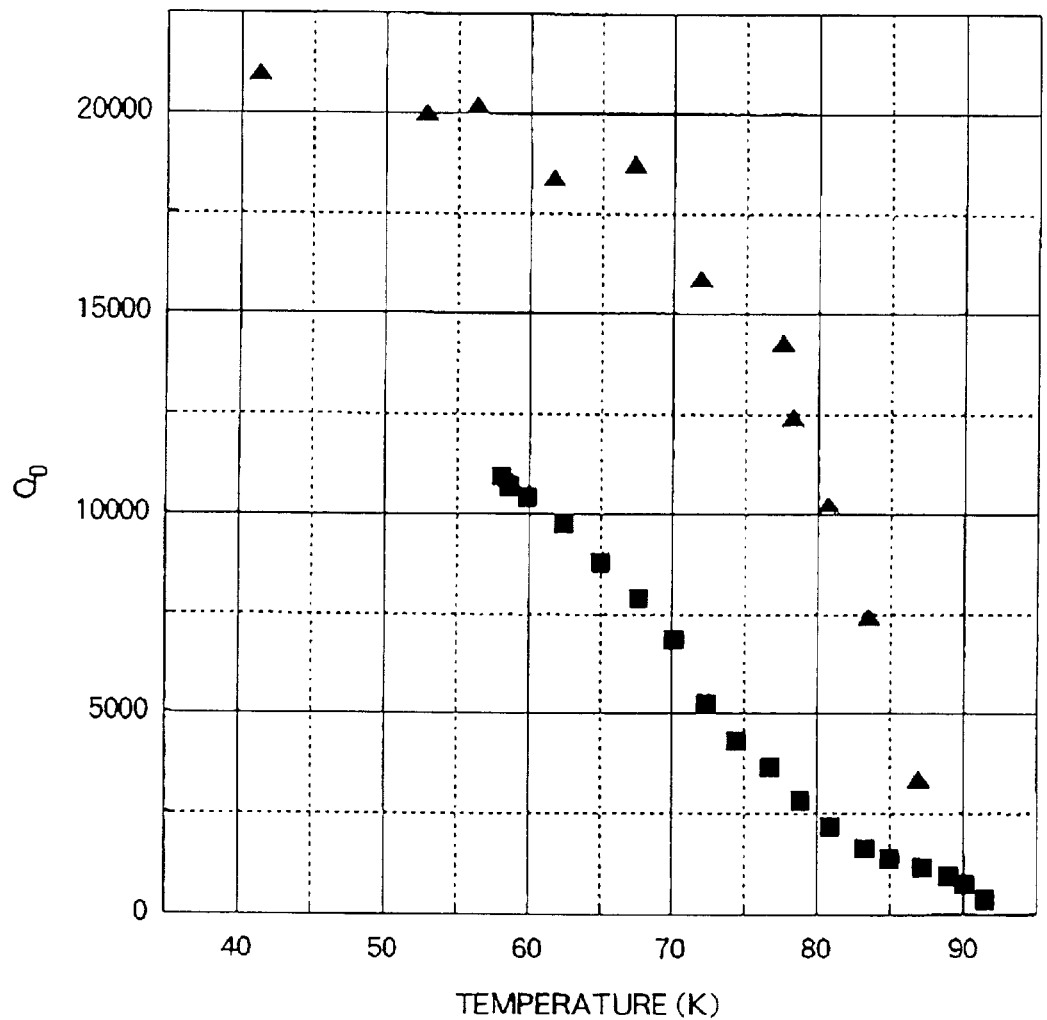
FIG. 8 is a graph showing the temperature change of unloaded Q values of micro strip resonators with a resonance frequency of 10.8 GHz in the fifth embodiment of the present invention.

The temperature change of unloaded Q ($Q_0$) values of micro strip resonators are shown in FIG. 8. In FIG. 8, square marks represent data of a film produced with a low oxygen atmosphere and a low temperature, and triangle marks represent data of a film produced with a high oxygen atmosphere and a high temperature, respectively. The resonator comprising the film produced with a low oxygen atmosphere and a low temperature showed $Q_0$=3500 at 77K and $Q_0$=11000 at 60K. On the other hand, the resonator comprising the film produced with a high oxygen atmosphere and a high temperature showed $Q_0$=14000 at 77K and $Q_0$=23000 at 40K. Since the $Q_0$ value is proportional to the reciprocal number of the film surface resistance in a micro strip resonator, it was learned that the surface resistance in a microwave region was reduced by the use of the film produced with a high oxygen atmosphere and a high temperature. As reasons for the characteristics improvement by the change of the film formation conditions, the following items can be presented:

(1) In the as grown state, oxygen is introduced into the film to some extent in the specimen produced in a high oxygen atmosphere (the C axis lattice constant sought by the X-ray diffraction method: 11.80 Å, whereas oxygen is considerably short in the specimen produced in a low oxygen atmosphere (the C axis lattice constant sought by the x-ray diffraction method: 11.83 to 11.85 Å. Therefore, also in the subsequent low temperature heat treatment in an oxygen atmosphere, oxygen is not sufficiently introduced into the film of the specimen produced in the low oxygen atmosphere so that a semiconductor phase or a phase to be transferred to the superconductivity at 60K remained partially to lead to the surface resistance increase.

(2) Since the film produced with a high oxygen atmosphere and a high temperature has a narrow full width at half maximum of the X-ray diffraction rocking curve and a small χ min value in RBS as shown in the third and fourth embodiments and thus the improvement in the crystalline property and the epitaxial property was confirmed, the film surface resistance was reduced owing to the crystalline property improvement.

As apparent from the explanation given above, according to the present invention, a thin film having excellent crystalline property and epitaxial property and a high critical current density can be produced at a high film formation rate on a simple substrate structure. Therefore, the present invention can contribute to the development of a high critical current superconductive lead, a superconductive wire, and a superconductive line material to provide a great industrial value.

Furthermore, according to the present invention, a film having excellent crystalline property and epitaxial property and a low surface resistance value can be produced with a liquid phase epitaxial method. Therefore, the present invention can contribute to the development of a high performance superconductive wire, and a superconductive microwave passive element to provide a great industrial value.

What is claimed is:

1. A production method of an oxide superconductive film comprising a liquid phase epitaxial growth method for producing an $ReBa_2Cu_3O_x$ film, where Re represents a lanthanoid element and x represents the oxygen amount, having a 123 type crystal structure from a molten liquid, wherein a substrate surface is inclined by 1 degree to 44 degrees with respect to said molten liquid surface at the time of separating said film from said molten liquid after film formation.

2. A production method of an oxide superconductive film as claimed in claim 1, wherein said substrate is rotated at 300 rpm to 3000 rpm for 5 seconds to 5 minutes after separating said film from said molten liquid.

3. A production method of an oxide superconductive film as claimed in claim 1, wherein the film formation atmosphere contains 2 atm of oxygen and 98 atm of nitrogen, and the film formation temperature is 900 to 970° C.

4. A production method of an oxide superconductive film as claimed in claim 1, wherein said molten liquid contains 10% by weight of $Y_1Ba_2Cu_3Ox$ and 90% by weight of $Ba_3Cu_7O_{10}$.

5. A production method of an oxide superconductive film as claimed in claim 1, wherein said substrate is MgO (100).

6. A production method of an oxide superconductive film as claimed in claim 1, wherein the rate of pulling said substrate from said molten liquid is 1 mm/min to 10 mm/min.

7. A production method of an oxide superconductive film as claimed in claim 1, wherein the difference between the film formation temperature and the decomposition temperature of $ReBa_2Cu_3O_x$ at 1 atmosphere pressure is 30° C. or less.

8. A production method of an oxide superconductive film as claimed in claim 1, wherein said lanthanoid is Y or Nd.

9. A production method of an oxide superconductive film as claimed in claim 7, wherein said lanthanoid is Y or Nd.

10. A production method of an oxide superconductive film as claimed in claim 1, wherein the atmosphere at the time of forming said film and cooling a substrate contains at least 2 atm % of oxygen.

* * * * *